(12) United States Patent
Teo et al.

(10) Patent No.: US 11,688,826 B2
(45) Date of Patent: Jun. 27, 2023

(54) LIGHT EMITTING DEVICE, METHOD OF FABRICATING SAME AND METHOD OF CONTROLLING LIGHT EMISSION

(71) Applicant: AGENCY FOR SCIENCE, TECHNOLOGY AND RESEARCH, Singapore (SG)

(72) Inventors: Ee Jin Teo, Singapore (SG); Yi Shi, Singapore (SG); Chengyuan Yang, Singapore (SG); Qing Yang Steve Wu, Singapore (SG); Yin Thai Chan, Singapore (SG); Yang Xu, Singapore (SG); Chi Jin Darren Neo, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 419 days.

(21) Appl. No.: 16/611,547

(22) PCT Filed: Jun. 5, 2018

(86) PCT No.: PCT/SG2018/050279
§ 371 (c)(1),
(2) Date: Nov. 7, 2019

(87) PCT Pub. No.: WO2018/226157
PCT Pub. Date: Dec. 13, 2018

(65) Prior Publication Data
US 2020/0203560 A1    Jun. 25, 2020

(30) Foreign Application Priority Data

Jun. 5, 2017 (SG) .............................. 10201704585P

(51) Int. Cl.
*H01L 33/06* (2010.01)
*H01L 33/00* (2010.01)

(52) U.S. Cl.
CPC .......... *H01L 33/06* (2013.01); *H01L 33/0004* (2013.01)

(58) Field of Classification Search
CPC . H01L 33/06; H01L 33/0004; H01L 51/5218; H01L 51/502; G02B 5/008;
(Continued)

(56) References Cited

U.S. PATENT DOCUMENTS

2005/0062903 A1\* 3/2005 Cok ...................... B82Y 20/00
349/69
2012/0032138 A1\* 2/2012 Kim .................... H01L 51/5048
438/46
(Continued)

FOREIGN PATENT DOCUMENTS

| CN | 105140412 A | 12/2015 |
| CN | 105405938 A | 3/2016 |
| JP | 2010-192829 A | 9/2010 |
| JP | 2010192829 | * 9/2010 |
| WO | WO-2016/014983 A1 | 1/2016 |

OTHER PUBLICATIONS

Office Action in SG Application No. 11201910423Q dated Oct. 6, 2020, 8 pages.
(Continued)

*Primary Examiner* — Benjamin Tzu-Hung Liu
(74) *Attorney, Agent, or Firm* — Marshall, Gerstein & Borun LLP

(57) ABSTRACT

A light emitting device, a method of fabricating a light emitting device and a method of controlling light emission. The light emitting device includes a plasmonic structure. The plasmonic structure is configured to have a plurality of localized surface plasmon resonances. The light emitting device also includes a broadband light emitting layer having (Continued)

an emission spectrum substantially overlapping wavelengths of the localized surface plasmon resonances. A spacer layer is disposed between the plasmonic structure and the broadband light emitting layer. A color of light emitted by the broadband light emitting layer is tunable by the localized surface plasmon resonances of the plasmonic structure.

19 Claims, 14 Drawing Sheets
(12 of 14 Drawing Sheet(s) Filed in Color)

(58) Field of Classification Search
CPC .... G02B 5/0231; G02B 5/1809; G02B 1/005; B82Y 20/00; B82Y 40/00
See application file for complete search history.

(56) References Cited

U.S. PATENT DOCUMENTS

| | | | |
|---|---|---|---|
| 2015/0001464 A1* | 1/2015 | Fukuura | C09K 11/56 977/774 |
| 2015/0155449 A1 | 6/2015 | Kim et al. | |
| 2016/0285036 A1* | 9/2016 | Wang | H10K 50/15 |
| 2018/0284509 A1* | 10/2018 | Chanda | G02B 5/008 |

OTHER PUBLICATIONS

Search Report and Written Opinion in International Application No. PCT/SG2018/050279 dated Aug. 27, 2018, 13 pages.

* cited by examiner

LIGHT EMITTING DEVICE, METHOD OF FABRICATING SAME AND METHOD OF CONTROLLING LIGHT EMISSION

FIELD OF INVENTION

The present invention relates broadly, but not exclusively, to a light emitting device, a method of controlling light emission, and a method of fabricating a light emitting device.

BACKGROUND

Quantum dots (QD) offer great promise to the development of optoelectronic devices due to their high quantum yield, extremely narrow emission, spectral tunability and high stability. They can be used in solid state lighting, information displays, imaging detectors and photovoltaics. QD light emitting diodes (LEDs) displays are of particular interest due to their wide-ranging color tunability and high color saturation.

However, the challenge lies in the ability to pattern/stack red-green-blue (RGB) QDs into high resolution pixels over a large area. Conventional techniques such as lithography and spincoating can cause cross-contamination of the RGB pixels. Other methods such as inkjet printing of different RGB QDs serially on the substrates, transfer printing and electrohydrodynamic jet printing have also been attempted. However, these printing methods are not compatible with standard semiconductor processing technologies. Moreover, they are rather time consuming, as different colors need to be mixed separately and deposited one at a time to generate different color emission.

A need therefore exists to provide devices and methods that can address at least one of the above problems.

SUMMARY

An aspect of the present invention provides a light emitting device comprising a plasmonic structure configured to have a plurality of localized surface plasmon resonances; a broadband light emitting layer comprising an emission spectrum substantially overlapping wavelengths of the localized surface plasmon resonances; and a spacer layer disposed between the plasmonic structure and the broadband light emitting layer; wherein a color of light emitted by the broadband light emitting layer is tunable by the localized surface plasmon resonances of the plasmonic structure.

The spacer layer may comprise a thickness configured to enable exciton-plasmon coupling between the broadband light emitting layer and the plasmonic structure.

The device may be configured to be integrated to a light emitting diode (LED) structure such that the charge injection or transport layer of the LED structure comprises the spacer layer and is disposed between the plasmonic structure and the broadband light emitting layer.

The device may be configured to be integrated to a light emitting diode (LED) structure such that an electron injection layer of the LED structure comprises the plasmonic structure.

The plasmonic structure may comprise a plurality of periodicities corresponding to the plurality of localized surface plasmon resonances.

The plasmonic structure may be configured to control at least one of a polarization, beam direction and phase of light emitted by the broadband light emitting layer.

The plasmonic structure may comprise a nanostructured array.

The broadband light emitting layer may comprise a plurality of narrowband emitters, each narrowband emitter having respective spectral peak. The narrowband emitters may comprise quantum dots.

The broadband light emitting layer may comprise of at least one broadband emitter, or at least one narrowband emitter and at least one broadband emitter.

Another aspect of the present invention provides a method of controlling light emission comprising providing a plasmonic structure capable of having a plurality of localized surface plasmon resonances; providing a broadband light emitting layer adjacent to the plasmonic structure to enable exciton-plasmon coupling between the broadband light emitting layer and the plasmonic structure, the broadband light emitting layer comprising an emission spectrum substantially overlapping wavelengths of the localized surface plasmon resonances; and controlling the localized surface plasmon resonances of the plasmonic structure to tune a color of light emitted by the broadband light emitting layer.

The method may further comprise providing a spacer layer between the plasmonic structure and the broadband light emitting layer, the spacer layer having a predetermined thickness to enable the exciton-plasmon coupling between the broadband light emitting layer and the plasmonic structure.

Providing the plasmonic structure may comprise providing a plurality of periodicities corresponding to the plurality of localized surface plasmon resonances.

The method may further comprise controlling, by the plasmonic structure, at least one of a polarization, beam direction and phase of the light emitted by the broadband light emitting layer.

The plasmonic structure may comprise a nanostructured array.

Providing the broadband light emitting layer may comprise providing a plurality of narrowband emitters, each narrowband emitter having respective spectral peak. The narrowband emitters may comprise quantum dots.

Providing the broadband light emitting layer may comprise providing at least one broadband emitter, or at least one narrowband emitter and at least one broadband emitter.

Controlling the localized surface plasmon resonances may comprise varying an enhancement factor.

Another aspect of the present invention provides a method fabricating a light emitting device, the method comprising forming a plasmonic structure having a plurality of periodicities corresponding to a plurality of localized surface plasmon resonances; forming a broadband light emitting layer comprising an emission spectrum substantially overlapping wavelengths of the localized surface plasmon resonances; and disposing a spacer layer between the plasmonic structure and the broadband emitting layer such that exciton-plasmon coupling between the broadband light emitting layer and the plasmonic structure is enabled.

Forming the broadband light emitting layer may comprise forming the layer in a single deposition step.

Forming the plasmonic structure may comprise patterning a nanostructured array.

BRIEF DESCRIPTION OF THE DRAWINGS

The patent or application file contains at least one drawing executed in color. Copies of this patent or patent application publication with color drawings will be provided by the Office upon request and payment of the necessary fee.

Embodiments of the invention will be better understood and readily apparent to one of ordinary skill in the art from the following written description, by way of example only, and in conjunction with the drawings, in which.

DETAILED DESCRIPTION

The example embodiments provide devices and methods capable of achieving tunable light emission with sub-wavelength spatial resolution using plasmonics. Colors of different hues that vary from white emission can be produced by tuning the relative R, G, B intensities in a controlled manner. Emission is enhanced by the plasmonic resonance in reflection and emission is reduced by plasmonic resonance in transmission. One example structure includes a plasmonic nanostructure array, a broadband emission layer which matches or is broader than the surface plasmon resonances of the plasmonic nanostructure array, and a spacer layer between the plasmonic nanostructure array and the broadband emission layer. Example applications and implementations include integrating such structures on top of a LED or into an electrically pumped LED.

As described in further details below, in order to achieve plasmonic tuning of the emission spectrum, in an example embodiment, a broadband emission layer is formed by mixing narrowband R,G,B QD emitters. In this way, a significant overlap of the emission spectrum with the surface plasmon (SP) resonance can be achieved while maintaining the color saturation of individual emitters. This layer is placed in close proximity to a plasmonic nanostructure array such that exciton-plasmon coupling occurs. Exciton-plasmon coupling enables emission enhancement at the localized surface plasmon (LSP) resonance wavelength, so that the relative RGB ratios can be independently controlled. Instead of shifting the PL emission, SP resonance increases the color intensity at the resonance wavelength such that the overall emission appears shifted towards the resonance emission. For example, an originally white layer may emit at different colors or hues depending on the periodicity of plasmonic nanostructures. Increasing the enhancement factor at the LSP can increase the color saturation to produce colors of different tones. Further, fine control of the color emission using plasmonic nanostructures can be achieved.

Figure 1:
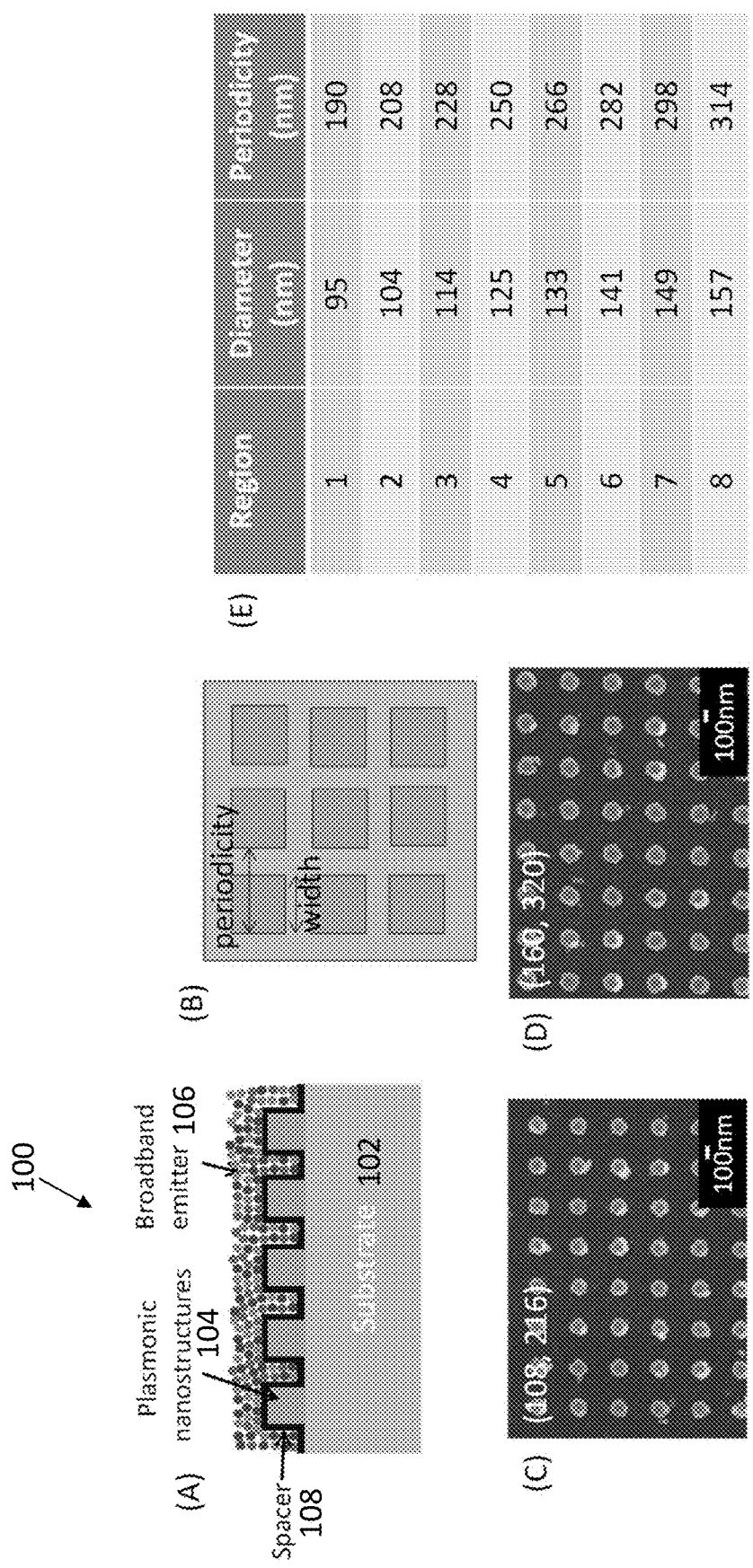
FIGS. 1(A)-(E) show details of a light emitting device according to an example embodiment.

FIGS. 1(A) and 1(B) show schematic diagrams illustrating a cross-sectional view and a plan view, respectively, of a light emitting device 100 according to an example embodiment. Typically, the device 100 is formed on a substrate 102 and includes a plasmonic structure 104, a broadband light emitting layer 106, and a spacer layer 108 disposed between the plasmonic structure 104 and the broadband light emitting layer 106. The plasmonic structure 104 is configured to have a plurality of localized surface plasmon resonances which include wavelengths within the visible light spectrum. The broadband light emitting layer 106 has an emission spectrum substantially overlapping the wavelengths of the localized surface plasmon resonances. In the light emitting device 100, a color of light emitted by the broadband light emitting layer 106 is tunable by the localized surface plasmon resonances of the plasmonic structure 104.

The fabrication and analysis of an example light emitting device 100 is described in detail below.

In one implementation, the broadband light emitting layer 106 can be in the form of a quantum dot (QD) layer deposited in close proximity to the plasmonic structure 104 in the form of a periodic array of Ag nanostructures. For example, the nanostructured array is first fabricated on coverslip by electron beam lithography in poly(methyl methacrylate) (PMMA) and subsequently deposited with 50 nm of Ag using electron beam evaporation. Subsequent lift-off can be performed after immersing it in acetone for 24 hours. The spacer layer 108 in the form of 10 nm $MgF_2$ is deposited by electron beam evaporation or atomic layer deposition to prevent direct contact and quenching of light emission by the metallic nanostructures. The QD layer is produced by mixing R,G,B CdSe QDs in a ratio of 5:40:1 and then spincoated onto the patterned substrate. FIGS. 1C-1D show scanning electron microscopy (SEM) images of an array of Ag nanopillars with periodicities of 216 nm and 320 nm, respectively. Furthermore, in order to produce localized plasmonic resonances (LSP) over the visible spectrum, a series of regions from 1 to 8 with different diameters and periodicities are fabricated, as shown in FIG. 1(E).

Figure 2:
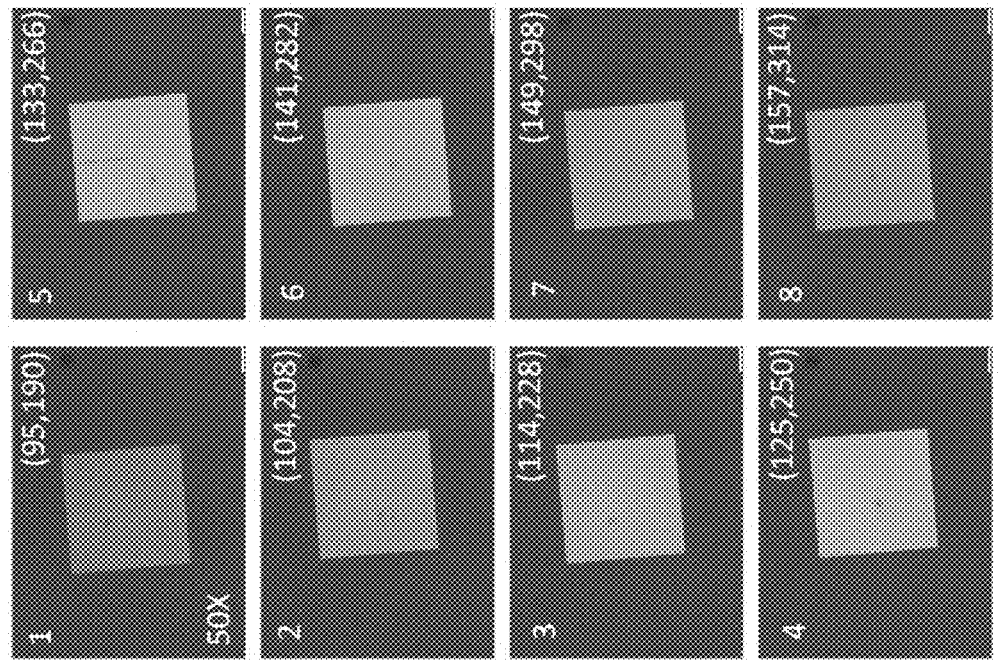
FIG. 2(A)-(B) show reflectance images of regions 1-8 of the device of FIG. 1.
Figure 2:
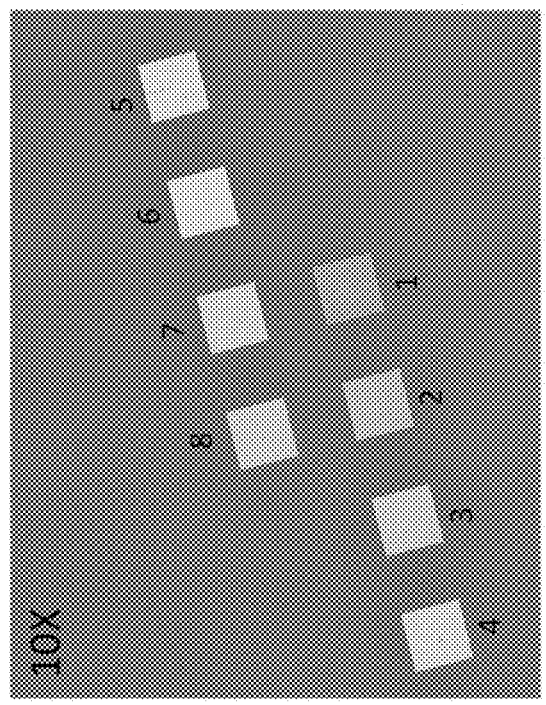

FIG. 2(A) shows the reflectance images of the Ag nanopillars described above with reference to FIGS. 1(A)-(E) collected with a UV-Visible-NIR Range Microspectrophotometer (e.g. CRAIC Technology QDI2010) under Xeon lamp illumination. An aluminum mirror is used as a reference for reflectance measurement. A series of colorful reflectance images ranging from blue to red can be seen in FIG. 2(A) as the periodicity increases from 190 nm to 314 nm. FIG. 2(B) shows a series of close-up images of regions 1 to 8 of FIG. 2(*a*), each in its own color and with its corresponding diameter and periodicity at the upper right hand corner.

Figure 3:
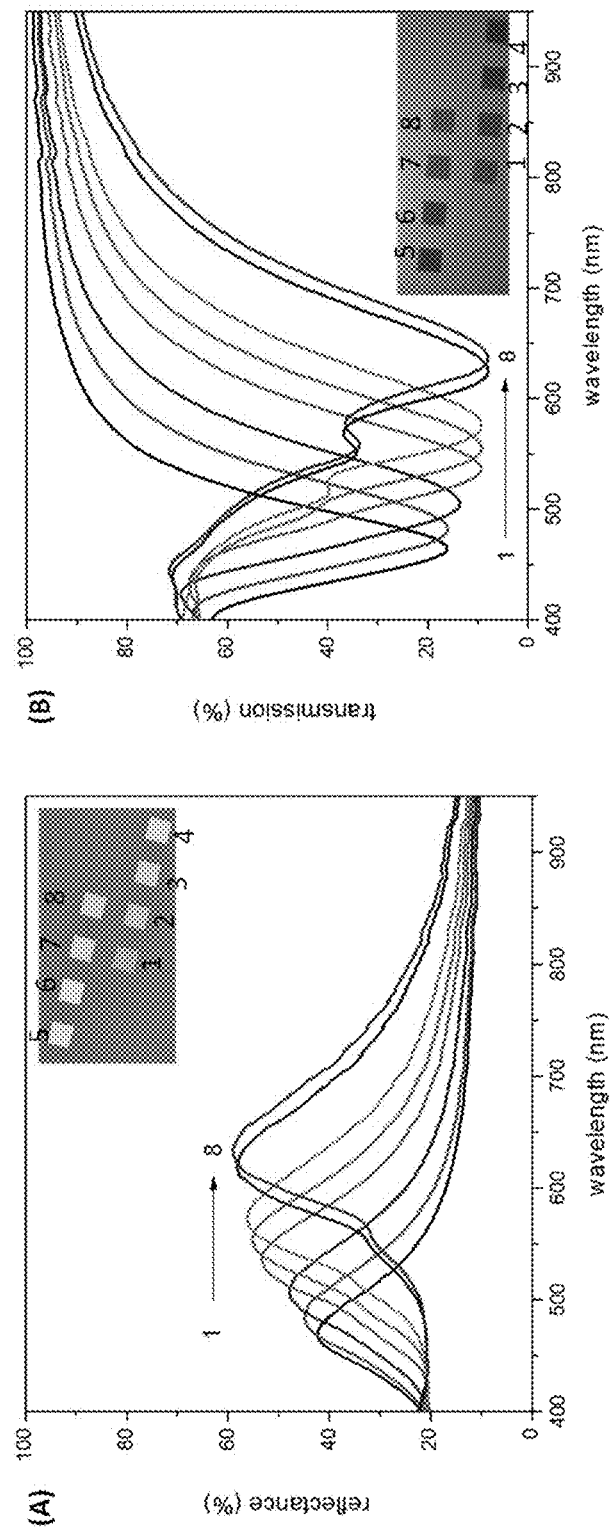
FIGS. 3(A) and (B) show reflectance and transmittance spectra, respectively, of regions 1-8 of the device of FIG. 1.

FIGS. 3(A) and (B) show the reflectance and transmittance spectra, respectively, of the Ag nanopillar array of FIGS. 1(A)-(E) collected using a 36× objective (NA 0.5). Such plasmonic nanostructures can be used in transmittance as well as reflectance. This can be important for LED or CMOS sensor applications where light is transmitted through the substrate. Strong reflectance peaks of up to 60% and minimum transmittance dips of 10% can be observed from FIGS. 3(A) and 3(B). This indicates the high efficiencies of these plasmonic color filters. As the periodicity increases from 190 nm to 314 nm, it can be seen that the resonance wavelength is continuously red-shifted from 462 nm to 637 nm. The width of the resonance is about 150 nm. This shows that the plasmonic resonance can be tuned over the whole visible light spectrum.

Figure 4:
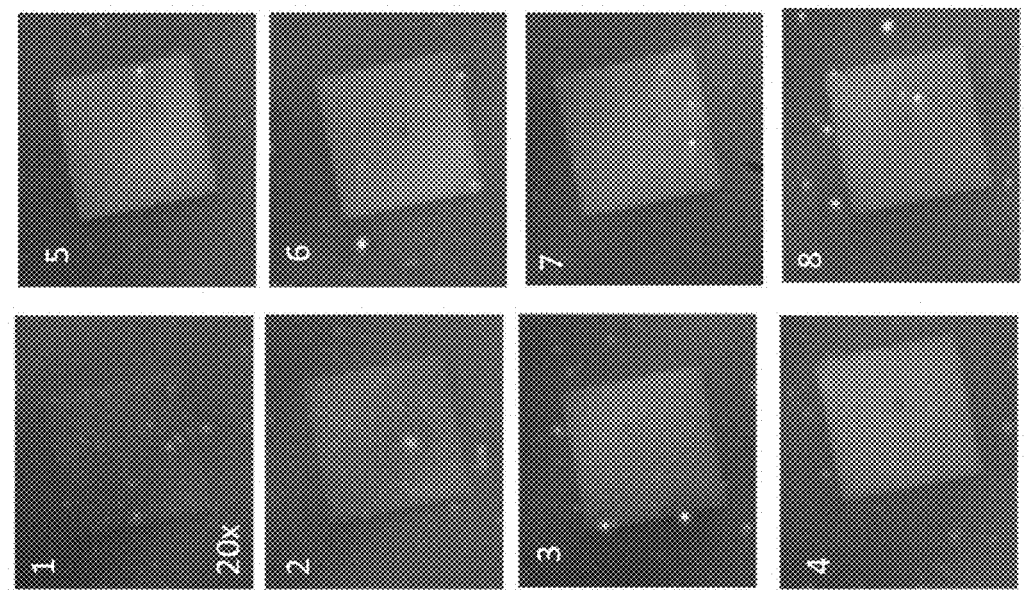
FIG. 4(A)-(B) show photoluminescence images of regions 1-8 of the device of FIG. 1.
Figure 4:
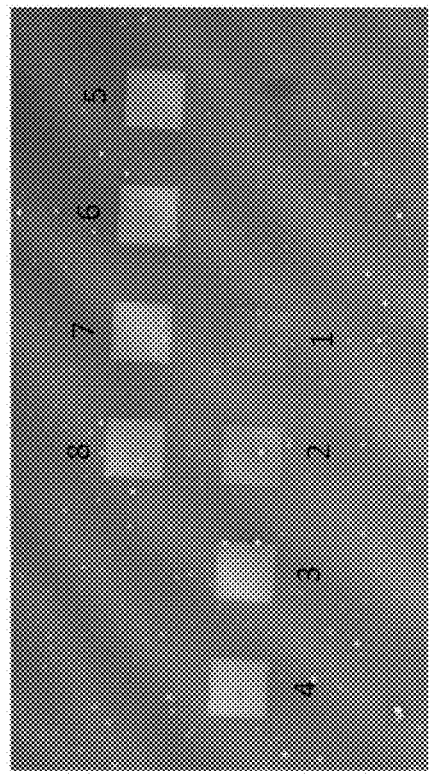
Figure 8:
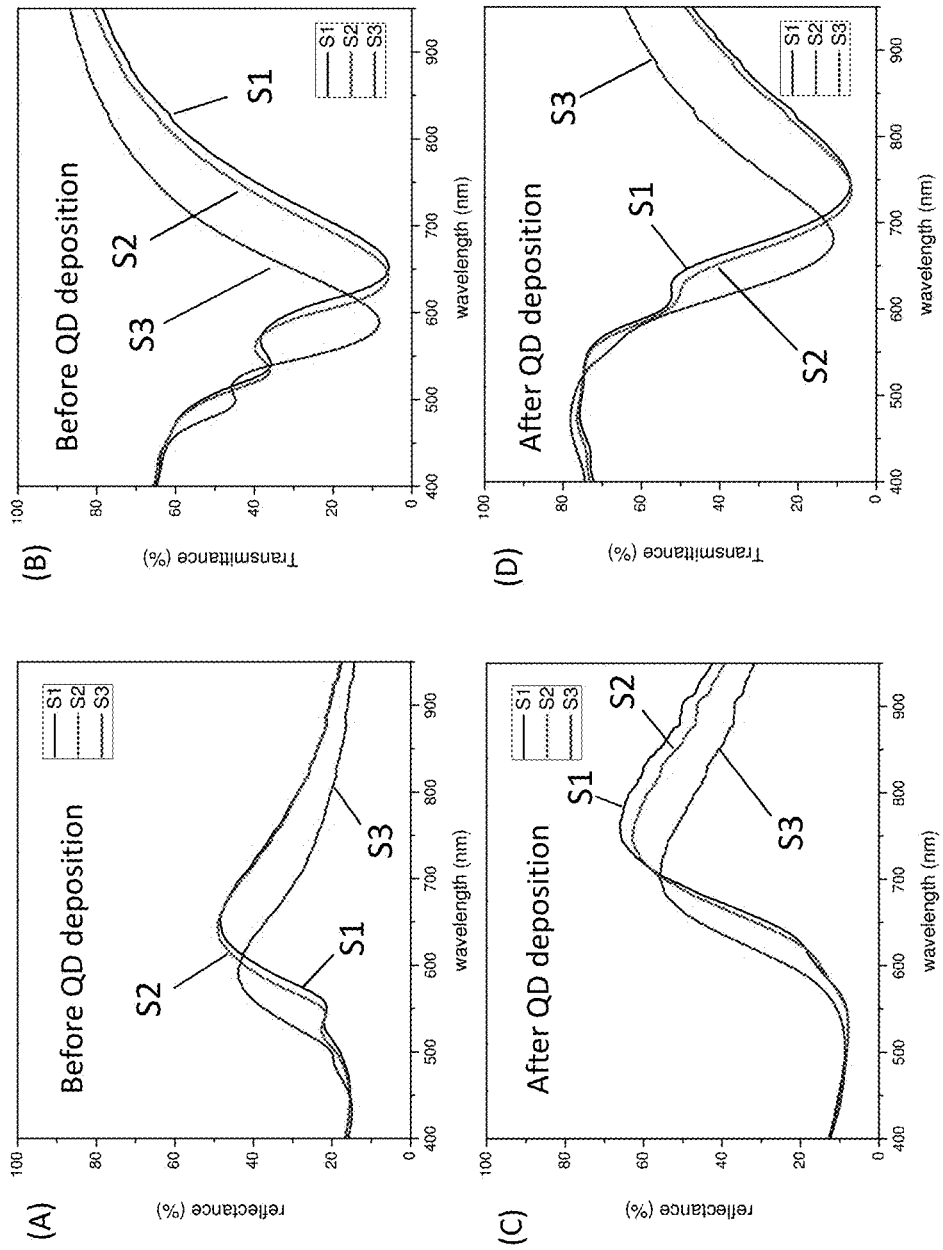
FIG. 8(A)-(D) show reflectance and transmittance spectra of samples before and after QD deposition.

Moreover, photoluminescence (PL) images and spectra are collected using an inverted fluorescence microscope (e.g. Nikon Eclipse TE2000-U). Light from halogen lamp (e.g. Nikon LHS-H100C-1) passes through the excitation filter (e.g. Nikon UV-2A, 330 nm-380 nm) is used to excite the sample. After passing through a longpass filter of 420 nm, PL images and PL signals are collected in reflection mode using a Nikon DS-Ri camera and a spectrometer (e.g. Ocean Optics QE65000) respectively. FIG. 4 shows the PL images of a white QD layer deposited over the Ag nanopillar array having regions 1 to 8 of different periodicities as described above with reference to FIGS. 1(A)-(E). The patterned regions 1-8 appear cyan, green, yellow, yellowish-green and pink as the periodicity is increased from 190 nm to 314 nm. An overall red-shift in color emission can be seen as the LSP resonance wavelength increases from blue to red. Although the PL emission displays a similar red-shift in SP resonance wavelength, the color emission is not exactly the same as the reflectance images. For example, region 1 looks blue in reflectance, while it looks cyan in PL emission. Also, region 8 in reflectance is red while it looks pink in color emission. In fact, it is red-shifted by about 90 nm. This is because the refractive index of the QD layer introduces a red-shift in the resonance wavelength. This is discussed in more detail below with reference to in FIG. 8. The broad resonances also enhance the intensity of more than one individual peak so that a combination of colors can be enhanced.

Figure 5:
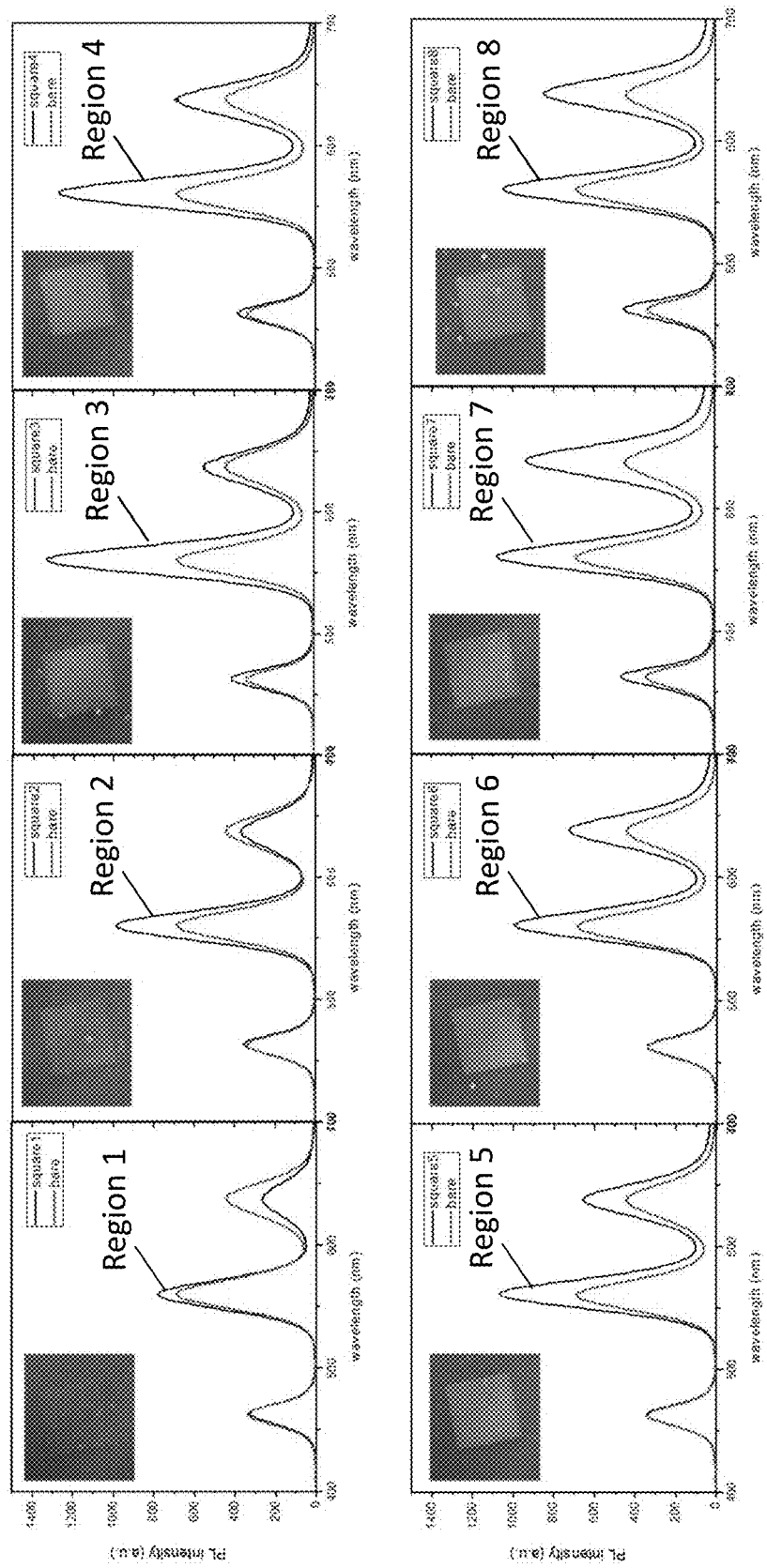
FIG. 5 shows photoluminescence spectra of regions 1-8 of the device of FIG. 1 against a reference spectrum.

FIG. 5 shows the PL spectra of regions 1 to 8 collected using a 60× objective. As the resonance wavelength increases from blue to red, it can be observed that the PL enhancement shift from the green peak to the red peak. For example, it can be seen that the intensity for the green peak increases from regions 1 to 4, and starts to decrease after that. The intensity of the red peak starts to increase from region 4 to 8. The resultant color emission will depend on the relative intensities of the R, G, B peaks. This makes the overall color emission shift from green to pink. It has also been noted that there is no observable shift in the individual wavelengths except their relative intensities. This means that it is possible to independently control the RGB intensity to produce colors of different hues and tones. Secondary colors such as cyan, magenta and pink can be obtained using this method. Higher saturation can be obtained when higher enhancement factors are obtained. In other words, the present devices and method can provide the versatility to achieve fine control of the color emission which is not possible using conventional printing methods.

Figure 6:
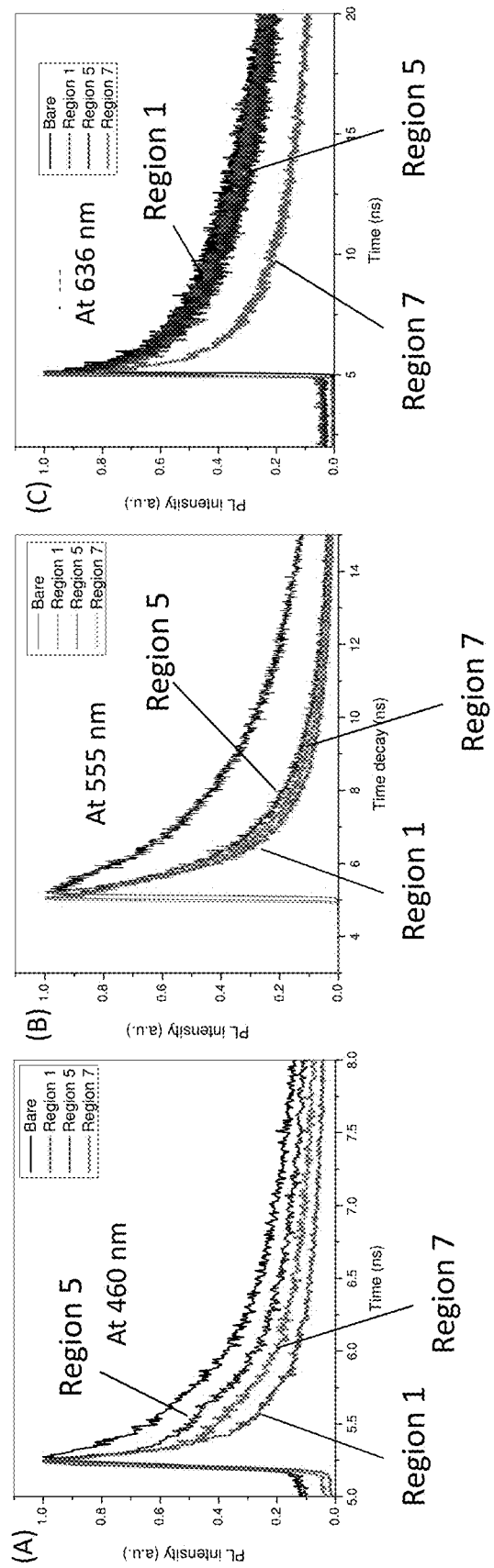
FIGS. 6(A)-(C) show time-resolved photoluminescence measurements of regions 1, 5 and 7 of the device of FIG. 1 at different wavelengths.

Further, in order to show the presence of exciton-plasmon coupling in the example embodiments, time-resolved photoluminescence (TRPL) has been carried on the regions 1, 5 and 7. These measurements are shown in FIG. 6. For region 1, which corresponds to the blue resonance wavelength, the fastest decay can be seen at 460 nm. No observable difference in decay rate can be observed for 555 nm wavelength for the three regions. For region 7, which corresponds to the red resonance wavelength, the fastest decay rate can be seen at 636 nm. From these measurements, it is noted that the decay rate enhancement is generally highest at the LSP resonance wavelength. At LSP resonance, the density of SP states increases significantly. When plasmonic nanostructures are placed in close proximity to the emitter, exciton-plasmon coupling occurs. The coupling increases the rate of radiative recombination and thus results in higher emission intensity, causing the color emission shift in the same manner as in the reflectance spectra, which confirms color tuning with plasmonic resonance. This is possible when the overall PL spectrum of the light emitting layer matches or is wider than the SP resonance of the plasmonic structure, and can be achieved by using multiple narrowband emitters, at least one broadband emitter, or a combination of at least one narrowband emitter and at least one broadband emitter.

As described, plasmonic tuning is a powerful technique that provides the ability to generate a full color spectrum in a single patterning step. This is in contrast with traditional printing methods where different color pigments need to be mixed separately and deposited onto the substrate one at a time to give rise to different hues, and different tones can only be controlled by the size and density of the ink.

Figure 7:
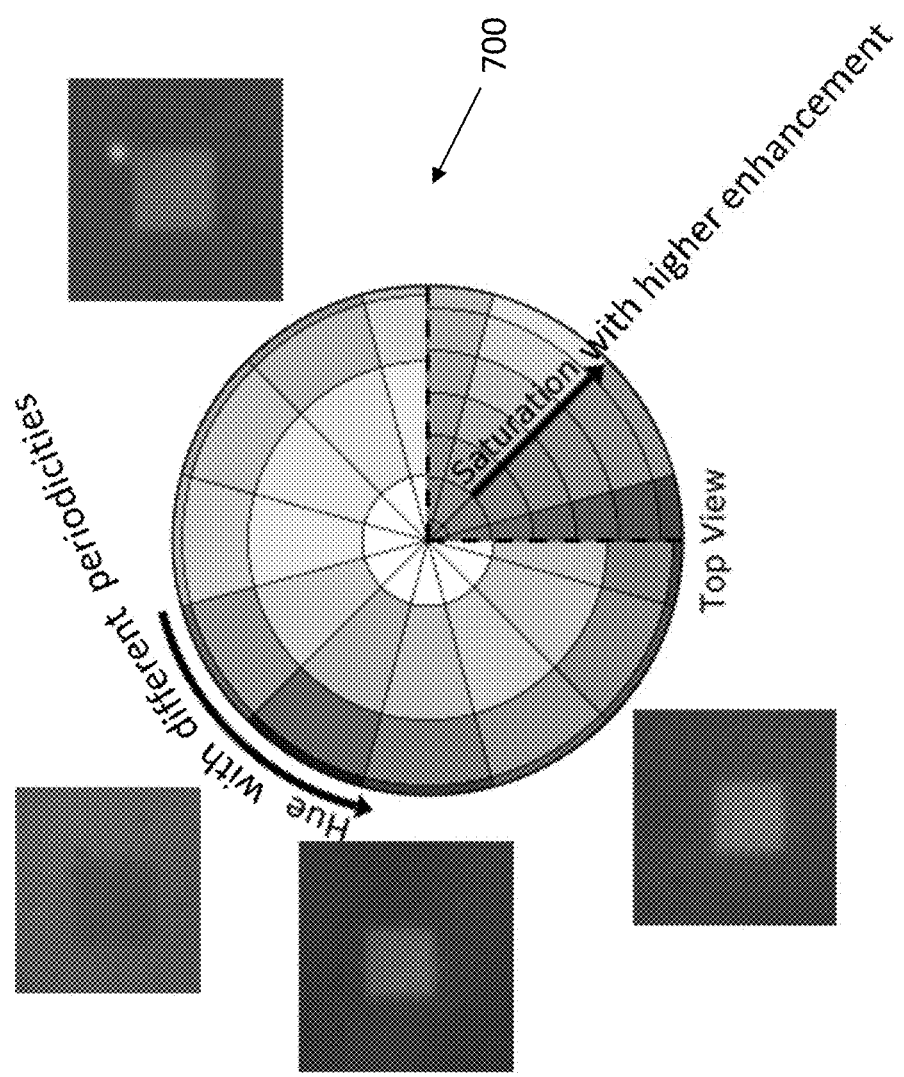
FIG. 7 shows a schematic diagram of a color wheel consistent with the example embodiment.

FIG. 7 shows a diagram of the color wheel 700 with different hues and tones that can be produced in a manner consistent with the example embodiments. From white emission at the center of the wheel 700, colors can change to other hues such as violet, pink, yellowish-green and blue by varying the periodicity of the plasmonic nanostructures. The color wheel 700 can be expanded outwards by increasing the color saturation with higher enhancement factors, thereby producing colors of different tones.

The effect of the emitter layer on the LSP resonance in achieving plasmonic tunable color emission has also been analysed. It has been noted that parameters such as refractive index and thickness of the emitting layer deposited over the plasmonic structures should not introduce extra strong peaks that are comparable with the main resonance peak. This would ruin the tuning capabilities of the plasmonic nanostructures. FIGS. 8(A) and (B) show the reflectance and transmittance spectra, respectively, of samples S1, S2 and S3 before QD deposition. After QD deposition, there is a red-shift of 90 nm in the LSP resonance wavelength (See FIGS. 8(C) and (D)). However, the general shape of the resonance is maintained and the relative increase in wavelength with periodicity is unchanged. This means that the tunability of the resonance with periodicity can be maintained. This also explains why the emission colors produced in FIG. 4 is red-shifted from the reflectance in FIG. 2.

Figure 9:
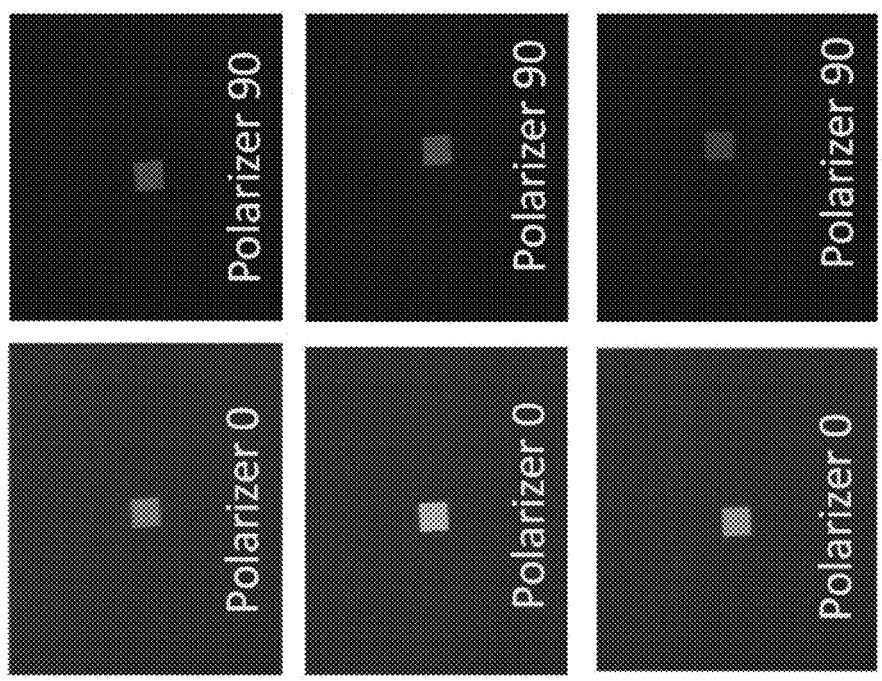
FIG. 9 show images comparing resonances at 0° polarization and 90° polarization.

The short-term target applications of plasmonic tunable white (i.e. broadband) QD layer in the example embodiments include QD backlighting, tunable white light source and even optical communications. Furthermore, plasmonics can be used to control the polarization of the light emission. For example, it is possible to achieve tunable polarized SP resonance from blue to red by varying the periodicities of metallic gratings, so that polarized color emissions can be produced at 0° polarization. FIG. 9 shows a series of images comparing the resonances at 0° polarization (left column) and 90° polarization (right column). This feature can be used for QD based backlighting, since an external polarizer which cuts off more than 50% of light emission is not required. This also reduces the thickness of the display significantly. In another example, polarization control may be used as a form of multiplexing in optical communications. It is also noted that the present devices are suitable for large scale production.

Figure 10:
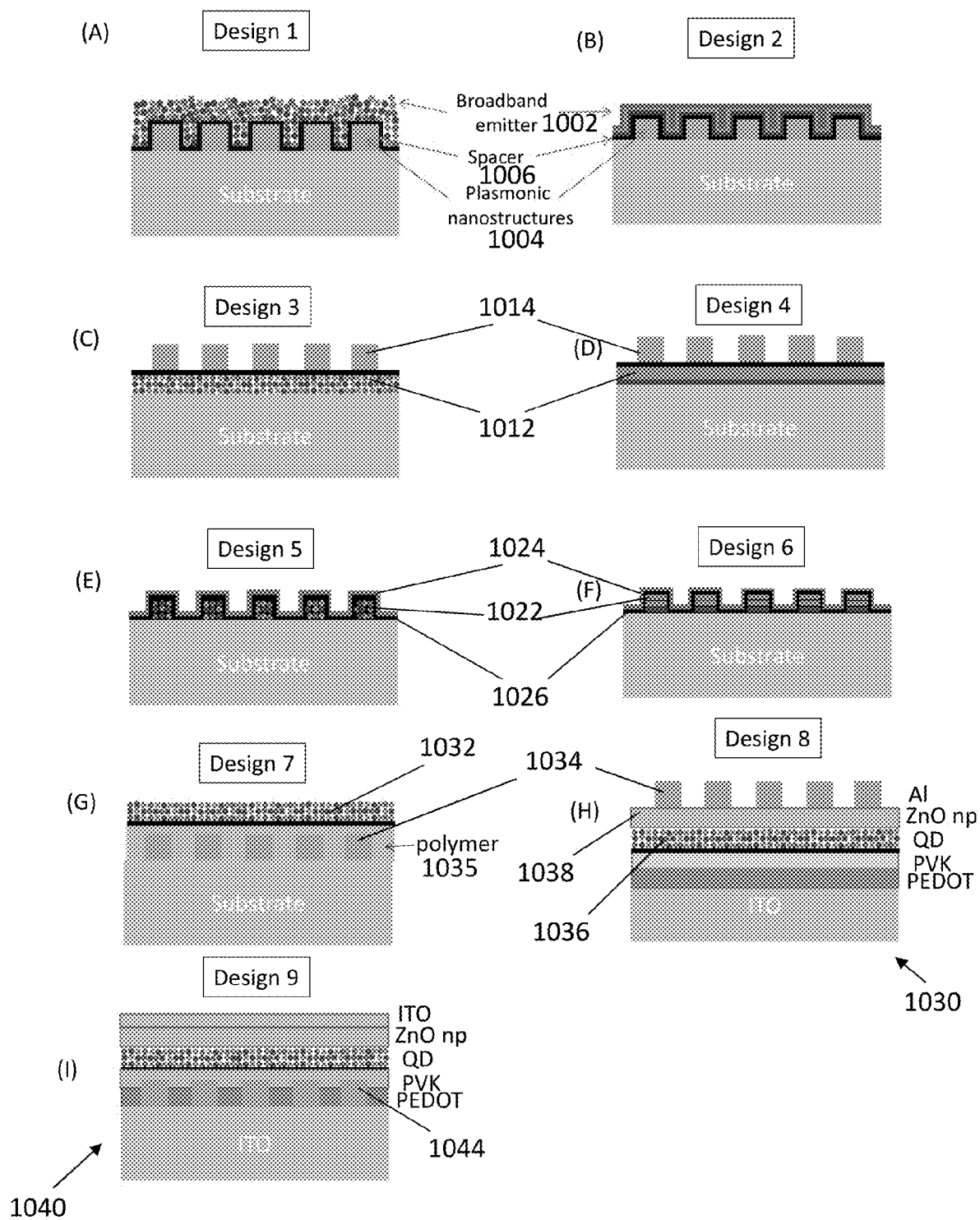
FIG. 10 show cross-sectional views of examples of integrating plasmonic nanostructures with QDs for tunable LED applications.

FIGS. 10(A)-(I) show cross-sectional views of examples of integrating plasmonic nanostructures with QDs for tunable LED applications. In such applications, the structures can be integrated directly on top of the LED as a color converter or into an electrically pumped QD-LED. For example, the broadband emitter can be created by mixing R, G, B QDs in a single layer (see designs 1, 3, 5, 7 as shown in FIGS. 10(A), (C), (E) and (G)) or depositing R,G,B layers sequentially into three layers (see designs 2, 4, 6 as shown in FIGS. 10(B), (D) and (F)). Plasmonic structures can be in the form of nanostructures, nanoholes, gratings, triangles, pillars, squares, or meta-surfaces, etc. They can have tunable LSP resonances or even control over the polarization, phase, and beam emission direction. The color of the white broadband layer may vary, depending on the resonances, polarization, phase, or beam emission direction. In designs 1 and 2, the broadband emitter 1002 is deposited on top of the plasmonic nanostructures 1004. A thin spacer layer 1006 is used to separate the broadband emitter 1002 and the plasmonic nanostructures 1004. In designs 3 and 4, the plasmonic nanostructures 1014 are fabricated on top of the broadband emitter 1012. In designs 5 and 6, the broadband emitter 1022 is patterned instead of the plasmonic nanostructures. The spacer layer 1026 and plasmonic layer 1024 are then deposited over the patterned broadband emitter layer. In design 7 (FIG. 10(G)), the QDs 1032 are deposited on top of the plasmonic nanostructures 1034 and separated with a polymer 1035 that is used for spacer. In design 8 (FIG. 10(H)), the plasmonic structures 1034 are integrated on top of a QD-LED 1030, which has an electron transport layer 1038 thin enough for exciton-plasmon coupling, such that the electron transport layer 1038 forms the spacer layer between the plasmonic structures 1034 and broadband emitter 1036. For example, an Al layer can be patterned for forming the plasmonic structures 1034 as well as serve as an electrode. Another way to incorporate the plasmonic structures 1044 into an electrically pumped QD-LED 1040 is shown in design 9 (FIG. 10(1)) where the plasmonic structures 1044 are embedded in the charge injection or transport layer of the QD-LED 1040. The QD-LEDs with the structures integrated as described above can produce multi-color emission with sub-wavelength resolution. Colors can be additive or complementary of resonance wavelength, depending on direction of emission. This can be used for a high-definition color display. Also, such feature can add a new dimension and flexibility to QD-based optoelectronics.

Figure 11:
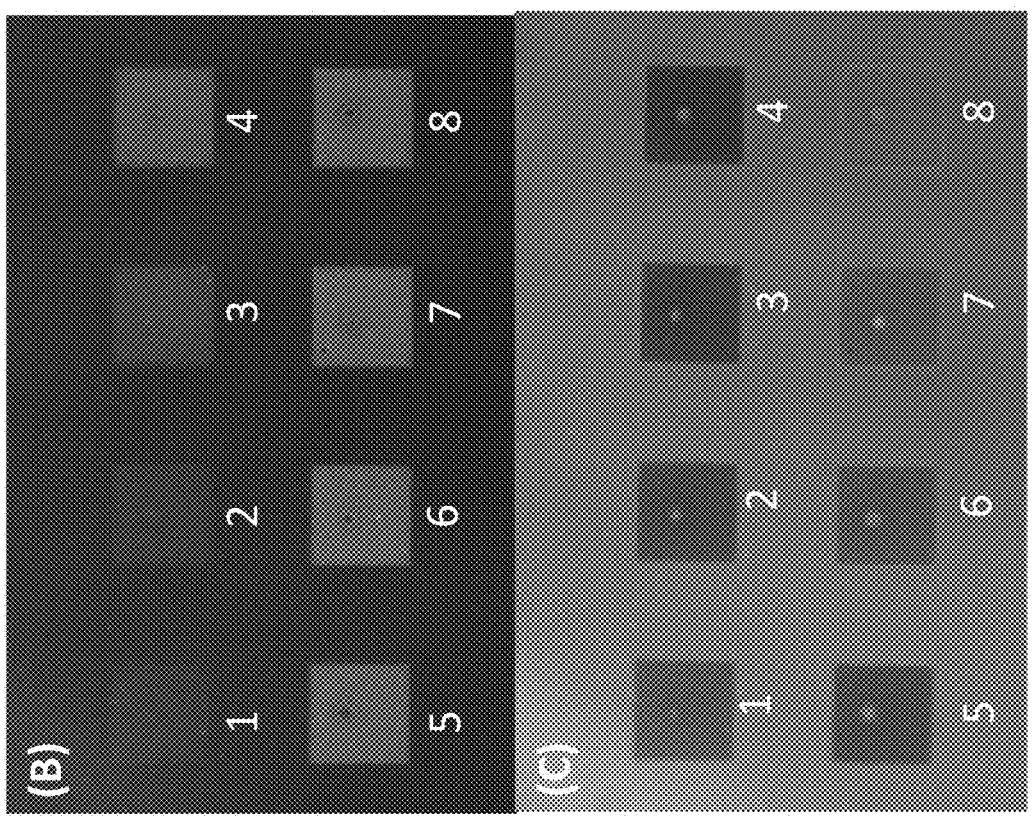
FIG. 11 show results of emission performance of patterned squares with increasing plasmonic resonance wavelengths.
Figure 11:
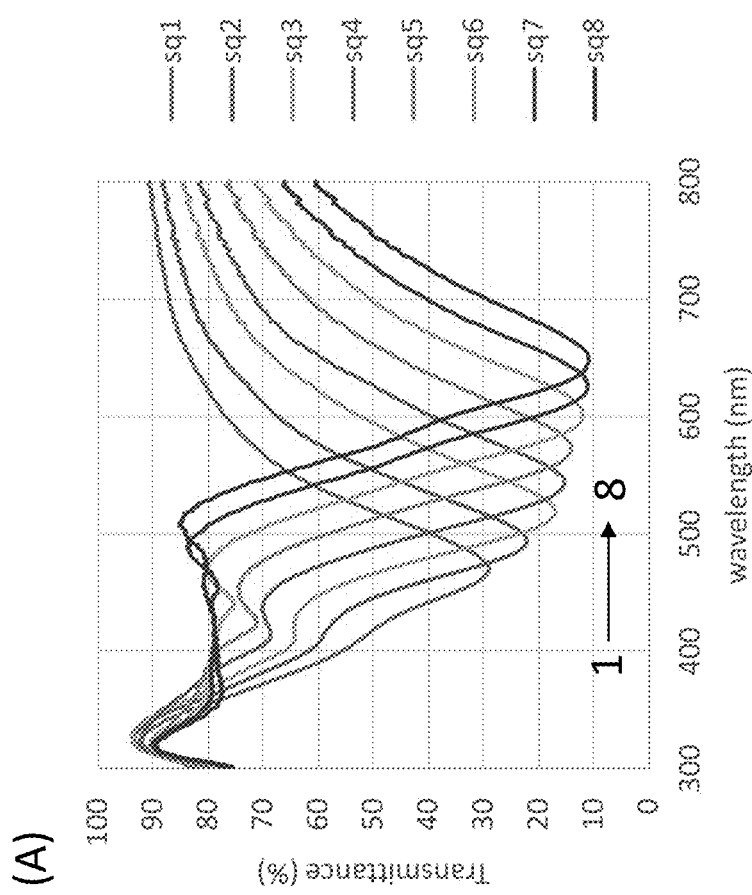
Figure 12:
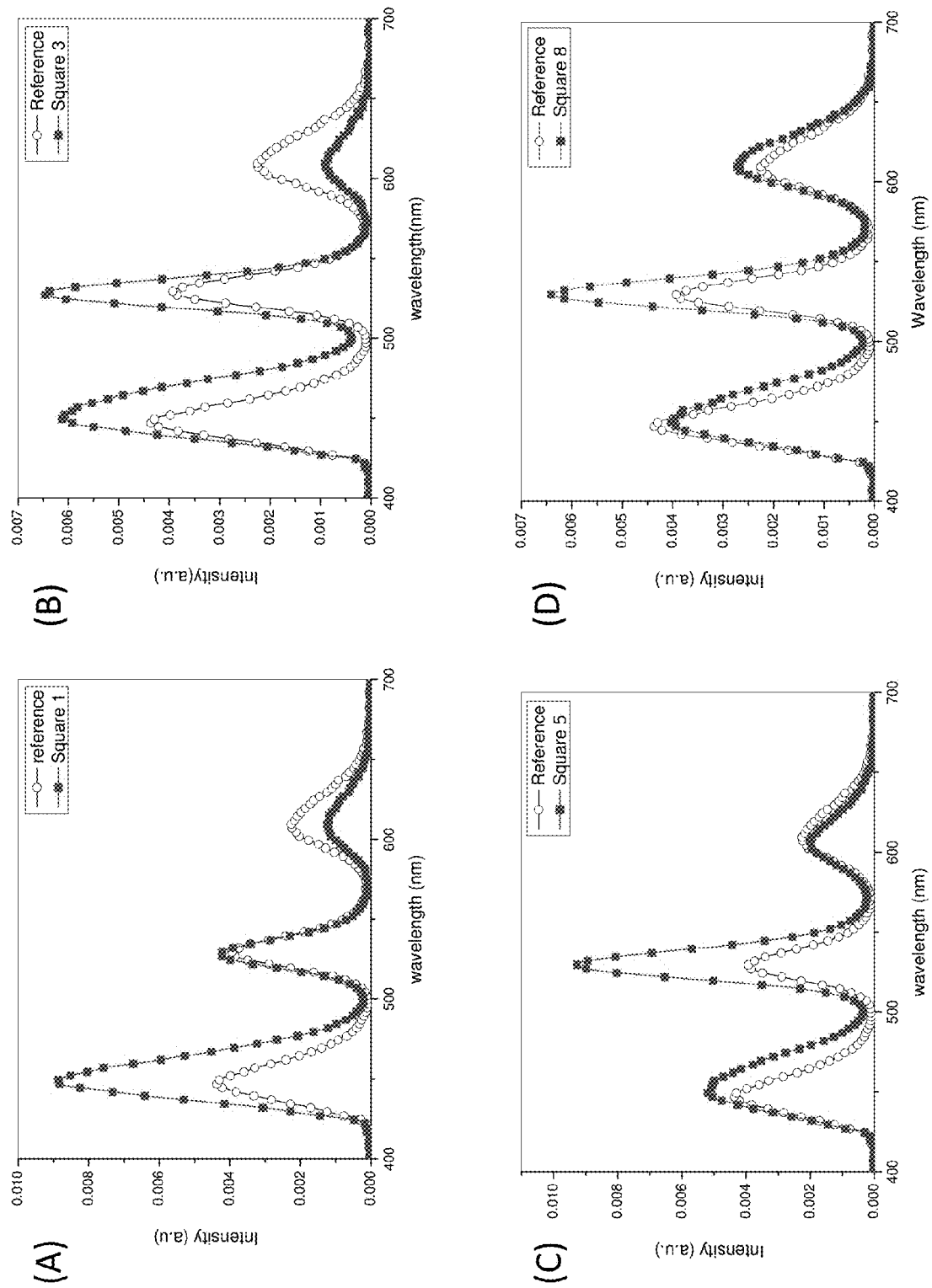
FIG. 12 shows the photoluminescence spectra of patterned squares shown in FIG. 11.

In a further analysis, patterned squares from 1 to 8 with plasmonic resonance ranging from 470 nm to 650 nm (see FIG. 11(A)) have been studied. The high transmittance dip ranges from 30% to 10%. The plasmonic structures are then deposited with polymer spacer/RGB QDs as seen in design 7 of FIG. 10(G) and excited using UV lamp. When the QD emission is collected in reflection from the plasmonic structures (see FIG. 11(B)), it is observed that QD emission is enhanced at the resonance wavelength. The PL is shifted from blue to yellow emission with respect to the background, in the same manner as the resonance shift. The colors look vivid and vibrant and its tones can be shifted continuously too. When QD emission is collected in transmission through the plasmonic structures (see FIG. 11(C)), the color emission becomes inverted from FIG. 11(B), as the colors are reduced at the resonance. This means it is possible to produce additive color emission in reflectance and subtractive color emission in transmittance using plasmonic resonances. FIG. 12 (A-D) show the PL spectra collected from squares 1, 3, 5 and 8 in reflection mode as compared against reference spectra, and the corresponding enhancement in intensity due to resonance can be observed.

As described above example embodiments, the advantages of using plasmonic tuning of color emission as opposed to traditional methods of contact or inkjet printing methods include the ability to achieve sub-diffraction limit spatial resolution. There is also no need to perform multiple steps of color mixing and deposition, as full color spectrum can be generated in a single patterning step. Plasmonics can also be used to control other optical properties of light such as polarization, beam direction, or phase, so that colors can be varied based on at least one of these properties. This can add a new dimension and flexibility to QD-based optoelectronics. For example, the devices and methods as disclosed herein can find used in ultrahigh definition QD-displays, ultrafast QD downconverters for white light communications, single photon emitters, tunable solid-state lightings and photovoltaics.

Figure 13:
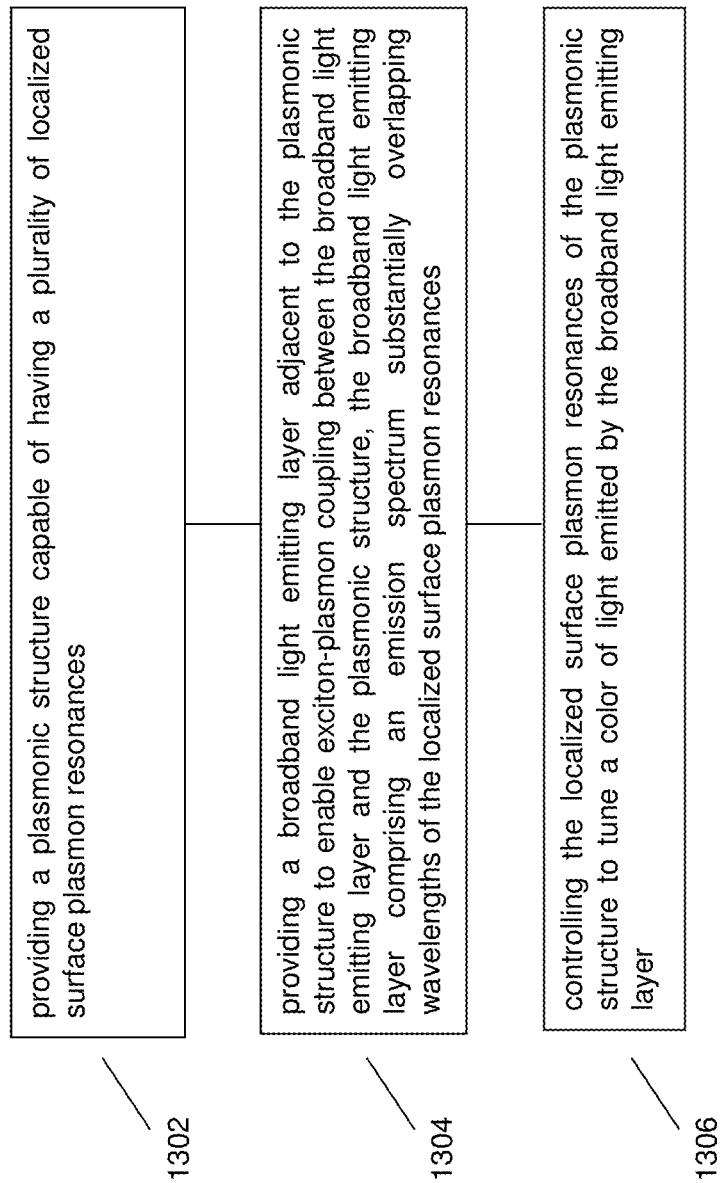
FIG. 13 shows a flowchart illustrating a method of controlling light emission according to an example embodiment.

FIG. 13 shows a flowchart 1300 illustrating a method of controlling light emission according to an example embodiment. At step 1302, a plasmonic structure capable of having a plurality of localized surface plasmon resonances is provided. At step 1304, a broadband light emitting layer is provided adjacent to the plasmonic structure to enable exciton-plasmon coupling between the broadband light emitting layer and the plasmonic structure. The broadband light emitting layer has an emission spectrum substantially overlapping wavelengths of the localized surface plasmon resonances. At step 1306, the localized surface plasmon resonances of the plasmonic structure are controlled to tune a color of light emitted by the broadband light emitting layer.

Figure 14:
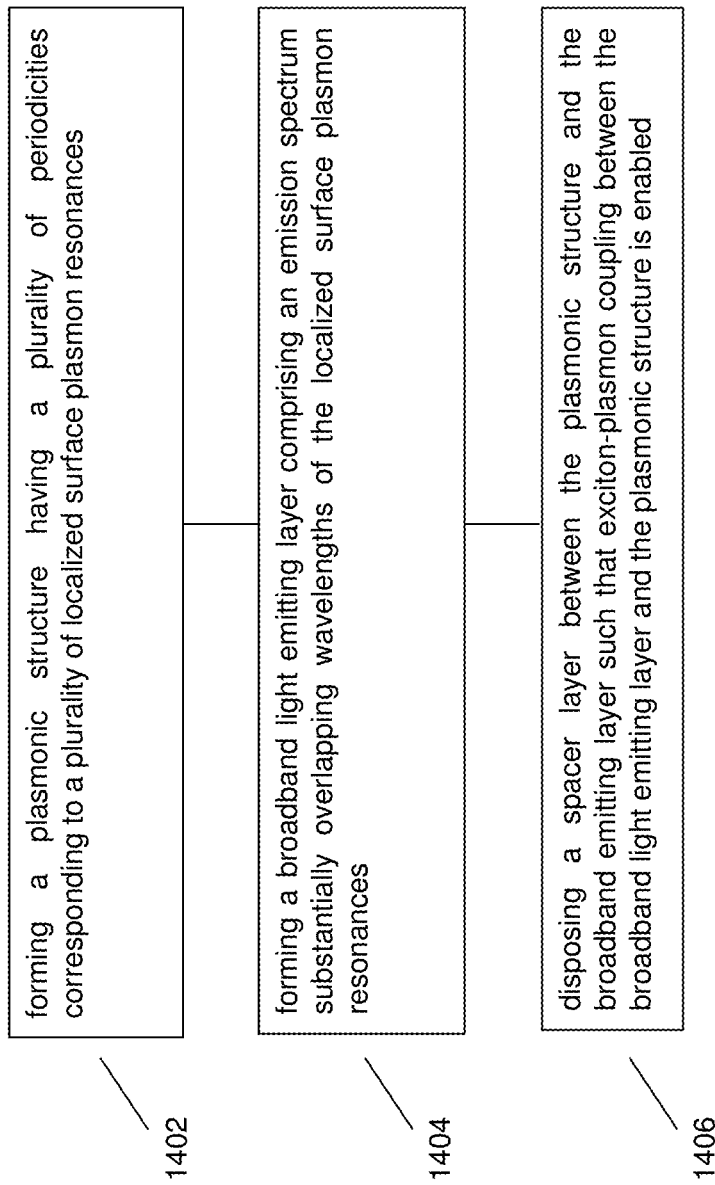
FIG. 14 shows a flowchart illustrating a method of fabricating a light emitting device according to an example embodiment.

FIG. 14 shows a flowchart 1400 illustrating a method of fabricating a light emitting device according to an example embodiment. At step 1402, a plasmonic structure having a plurality of periodicities corresponding to a plurality of localized surface plasmon resonances is formed. At step 1404, a broadband light emitting layer comprising emission spectrum substantially overlapping wavelengths of the localized surface plasmon resonances is formed. At step 1406, a spacer layer is disposed between the plasmonic structure and the broadband emitting layer such that exciton-plasmon coupling between the broadband light emitting layer and the plasmonic structure is enabled.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A light emitting device comprising:
a plasmonic structure comprising a plurality of periodicities, the plurality of periodicities configured to have a corresponding plurality of localized surface plasmon resonances;
a broadband light emitting layer comprising a mixture of a plurality of narrowband emitters, each narrowband emitter having a respective spectral peak, the broadband light emitting layer comprising an emission spectrum substantially overlapping wavelengths of the localized surface plasmon resonances; and
a spacer layer disposed between the plasmonic structure and the broadband light emitting layer;
wherein a color of light emitted by the broadband light emitting layer is tunable by relative intensities of the spectral peaks of the narrowband emitters, the intensities being modified by the localized surface plasmon resonances of the plasmonic structure; and
wherein the plasmonic structure is configured to control a polarization of light emitted by the broadband light emitting layer.

2. The light emitting device as claimed in claim 1, wherein the spacer layer comprises a thickness configured to enable exciton-plasmon coupling between the broadband light emitting layer and the plasmonic structure.

3. The light emitting device as claimed in claim 1, wherein the device is configured to be integrated to a light emitting diode (LED) structure such that a charge injection or transport layer of the LED structure comprises the spacer layer and is disposed between the plasmonic structure and the broadband light emitting layer.

4. The light emitting device as claimed in claim 1, wherein the device is configured to be integrated to a light emitting diode (LED) structure such that an electron injection layer of the LED structure comprises the plasmonic structure.

5. The light emitting device as claimed in claim 1, wherein the periodicities are in a range of 190 nm to 314 nm.

6. The light emitting device as claimed in claim 1, wherein the plasmonic structure is further configured to control at least one of a beam direction and a phase of light emitted by the broadband light emitting layer.

7. The light emitting device as claimed in claim 1, wherein the plasmonic structure comprises a nanostructured array.

8. The light emitting device as claimed in claim 1, wherein the narrowband emitters comprise quantum dots.

9. A method of controlling light emission comprising:
providing a plasmonic structure comprising a plurality of periodicities, the plurality of periodicities capable of having a corresponding plurality of localized surface plasmon resonances;
providing a broadband light emitting layer adjacent to the plasmonic structure to enable exciton-plasmon coupling between the broadband light emitting layer and the plasmonic structure, the broadband light emitting layer comprising an emission spectrum substantially overlapping wavelengths of the localized surface plasmon resonances, wherein providing the broadband light emitting layer comprises providing a mixture of a plurality of narrowband emitters, each narrowband emitter having a respective spectral peak; and
controlling the localized surface plasmon resonances of the plasmonic structure to modify relative intensities of the spectral peaks of the narrowband emitters to tune a color of light emitted by the broadband light emitting layer; and
controlling, by the plasmonic structure, a polarization of the light emitted by the broadband light emitting layer.

10. The method as claimed in claim 9, further comprising providing a spacer layer between the plasmonic structure and the broadband light emitting layer, the spacer layer having a predetermined thickness to enable the exciton-plasmon coupling between the broadband light emitting layer and the plasmonic structure.

11. The method as claimed in claim 9, wherein the periodicities are selected to be in a range of 190 nm to 314 nm.

12. The method as claimed in claim 9, further comprising controlling, by the plasmonic structure, at least one of a beam direction and a phase of the light emitted by the broadband light emitting layer.

13. The method as claimed in claim 9, wherein the plasmonic structure comprises a nanostructured array.

14. The method as claimed in claim 9, wherein the narrowband emitters comprise quantum dots.

15. The method as claimed in claim 9, wherein controlling the localized surface plasmon resonances comprises varying an enhancement factor.

16. A method fabricating a light emitting device, the method comprising:
forming a plasmonic structure having a plurality of periodicities corresponding to a plurality of localized surface plasmon resonances;
forming a broadband light emitting layer comprising an emission spectrum substantially overlapping wavelengths of the localized surface plasmon resonances, wherein forming the broadband light emitting layer comprises mixing a plurality of narrowband emitters, each narrowband emitter having a respective spectral peak; and
disposing a spacer layer between the plasmonic structure and the broadband emitting layer such that exciton-plasmon coupling between the broadband light emitting layer and the plasmonic structure is enabled,
wherein the plasmonic structure is formed such that the plasmonic structure controls a polarization of light emitted by the broadband light emitting layer and the localized surface plasmon resonances of the plasmonic structure modify relative intensities of the spectral peaks of the narrowband emitters to tune a color of light emitted by the broadband light emitting layer.

17. The method as claimed in claim 16, wherein forming the broadband light emitting layer further comprises forming the layer in a single deposition step.

18. The method as claimed in claim 17, wherein the single deposition step comprises spin-coating.

19. The method as claimed in claim 16, wherein forming the plasmonic structure further comprises patterning a nanostructured array.

* * * * *